United States Patent [19]
Burton

[11] Patent Number: 5,500,595
[45] Date of Patent: * Mar. 19, 1996

[54] SURFACE COIL HOLDER FOR MAGNETIC RESONANCE IMAGING

[76] Inventor: Edward M. Burton, 3540 Bermuda Dr., Birmingham, Ala. 35210

[*] Notice: The portion of the term of this patent subsequent to Jul. 12, 2011, has been disclaimed.

[21] Appl. No.: 273,405

[22] Filed: Jul. 11, 1994

Related U.S. Application Data

[63] Continuation of Ser. No. 10,059, Jan. 28, 1993, Pat. No. 5,329,234.

[51] Int. Cl.⁶ ................................................. G01R 33/34
[52] U.S. Cl. ......................................... 324/318; 128/653.5
[58] Field of Search .................................... 324/300, 322, 324/318, 314, 313; 128/653.2, 653.5

[56] References Cited

U.S. PATENT DOCUMENTS

| | | | |
|---|---|---|---|
| 4,649,348 | 3/1987 | Flugan | 324/318 |
| 4,684,894 | 8/1987 | Bliehall | 324/318 |
| 4,739,269 | 4/1988 | Kopp | 324/318 |
| 4,791,371 | 12/1988 | Krol | 324/318 |
| 4,870,363 | 9/1989 | Yassine et al. | 324/318 |
| 4,878,022 | 10/1989 | Carlson | 324/318 |
| 4,920,318 | 4/1990 | Misic et al. | 324/318 |
| 4,922,204 | 5/1990 | Duerr et al. | 324/318 |
| 5,057,777 | 10/1991 | Kurczewski | 324/318 |
| 5,143,068 | 9/1992 | Muennemann et al. | 324/318 |
| 5,154,178 | 10/1992 | Shah | 324/318 |
| 5,183,045 | 2/1993 | Takamura et al. | 324/318 |
| 5,329,234 | 7/1994 | Burton | 324/318 |

*Primary Examiner*—Sandra L. O'Shea
*Assistant Examiner*—Raymond Y. Mah
*Attorney, Agent, or Firm*—Malin, Haley DiMaggio & Crosby

[57] ABSTRACT

A surface coil holder for magnetic resonance imaging wherein the holder is provided with straps or tape for securing the holder to an MRI table and a body part of a patient. By preventing movement of the holder and the patient's body part during examination, image quality is maximized to thereby improve diagnostic accuracy. The holder is dimensioned for receiving a conventional 5" surface coil, and an insert is provided so that the holder can accommodate a conventional 3" surface coil.

2 Claims, 3 Drawing Sheets

SURFACE COIL HOLDER FOR MAGNETIC RESONANCE IMAGING

This is a continuation of application Ser. No. 08/010,059, filed Jan. 28, 1993, which is now U.S. Pat. No. 5,329,234.

BACKGROUND OF THE INVENTION

Magnetic resonance imaging (MRI) technology, which is a specialized field of nuclear magnetic resonance (NMR), is well-known in the medical field. Typically, a patient is placed on a flat surface and a surface coil is positioned under a specific body part of the patient to be imaged, such as, the patient's wrist, fingers, toes, foot, head or elbow. Various coil positioning arrangements have been proposed as evidenced by U.S. Pat. Nos. 4,684,894; 4,920,318; and 5,057,777.

The diagnostic quality of the MRI examination is dependent upon image resolution which is adversely affected by movement of the patient. Because children seldom voluntarily remain motionless during the course of the study, sedation of the child is frequently employed. Sedated children, and patients of all ages who sleep during the study, often have involuntary movements of the body part being examined, introducing motion to the images, thereby degrading image resolution.

To reduce the likelihood of voluntary or involuntary movement of the body part being examined which might degrade the quality of the image resolution, the surface coil holder of the present invention has been devised to affix the body part being examined to the surface coil in such a manner to thereby prevent movement of the body part, whereby image resolution is enhanced.

SUMMARY OF THE INVENTION

The surface coil holder of the present invention comprises, essentially, a transparent acrylic box having a removal top for containing a surface coil. An opening is provided in one of the end walls of the box through which the cable from the surface coil extends to be connected to a magnetic resonance scanner. A plurality of spaced pegs or posts are integral with the exterior surface of each side wall of the box to thereby provide guides for straps or tape extending around the box for securing the box and associated coil to the MRI table or pad, and for securing the patient's body part to be imaged to the top of the box whereby the body part is immobilized while being examined, thereby enhancing the quality of image resolution.

The holder is dimensioned to contain a 5" surface coil; however, for imaging small children, or localized small areas on adults, a 3" surface coil can be placed in the box. To accommodate the smaller coil, an insert is placed in the box and the 3" coil is positioned within the insert.

DESCRIPTION OF THE PREFERRED EMBODIMENT

Figure 1:
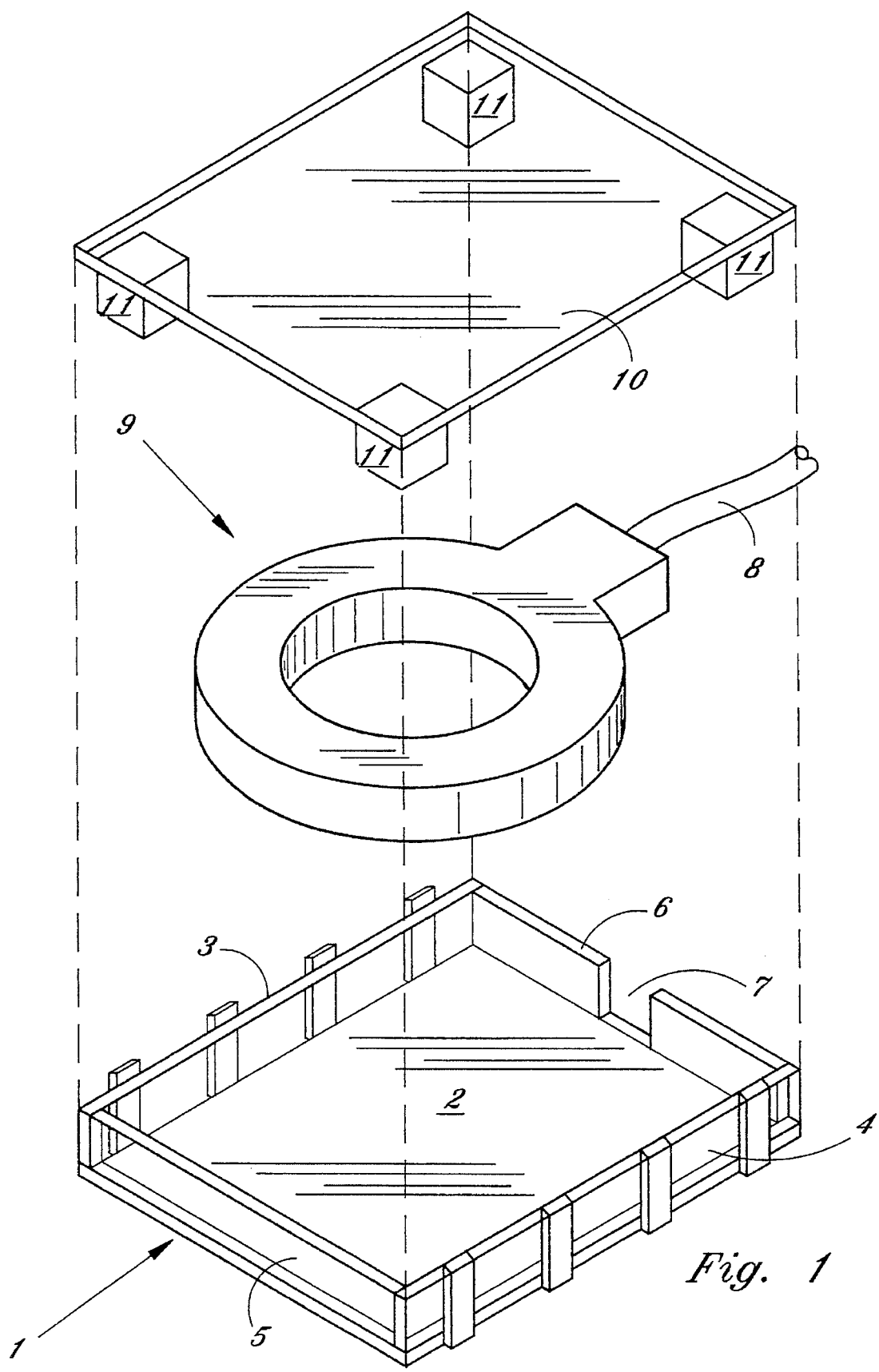
FIG. 1 is an exploded view showing the surface coil holder of the present invention and a surface coil.

Referring to the drawings and more particularly FIG. 1, the holder 1 of the present invention comprises a transparent acrylic rectangular box having a bottom wall 2, side walls 3 and 4, and end walls 5 and 6. The end wall 6 is provided with an opening 7 through which the cable 8 of a conventional surface coil 9 extends for connection to a magnetic resonance scanner, not shown.

Figure 2:
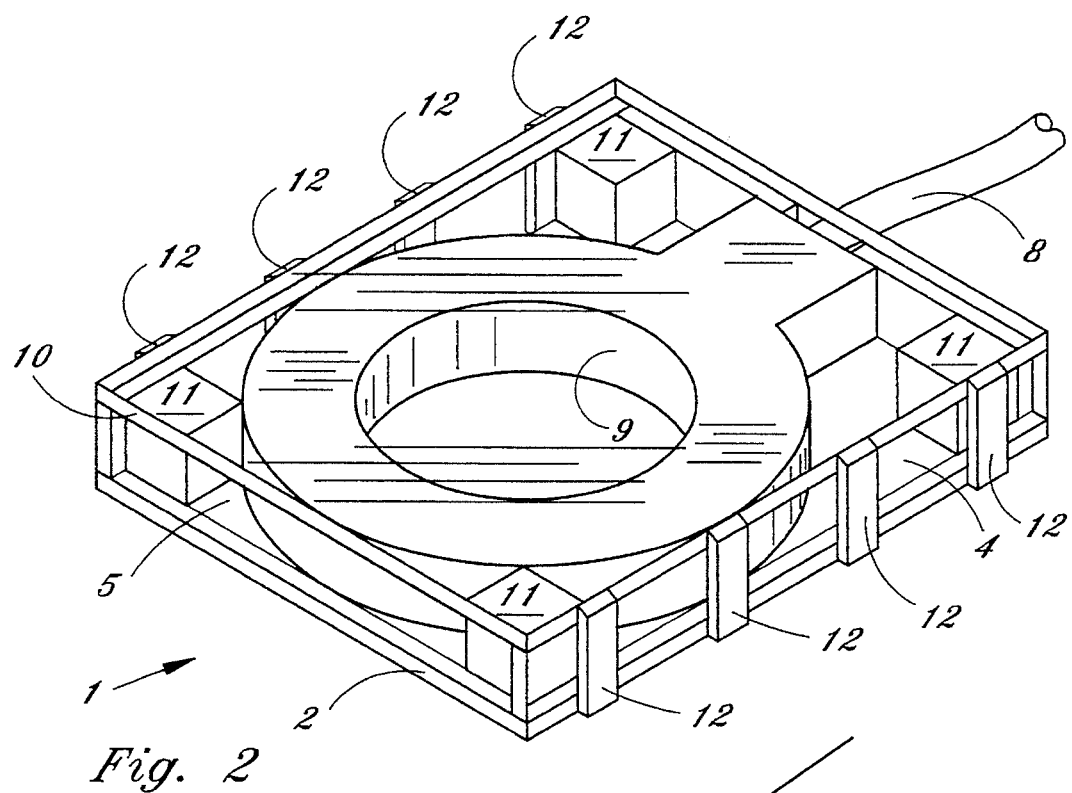
FIG. 2 is a perspective view of the holder having a surface coil contained therein.
Figure 3:
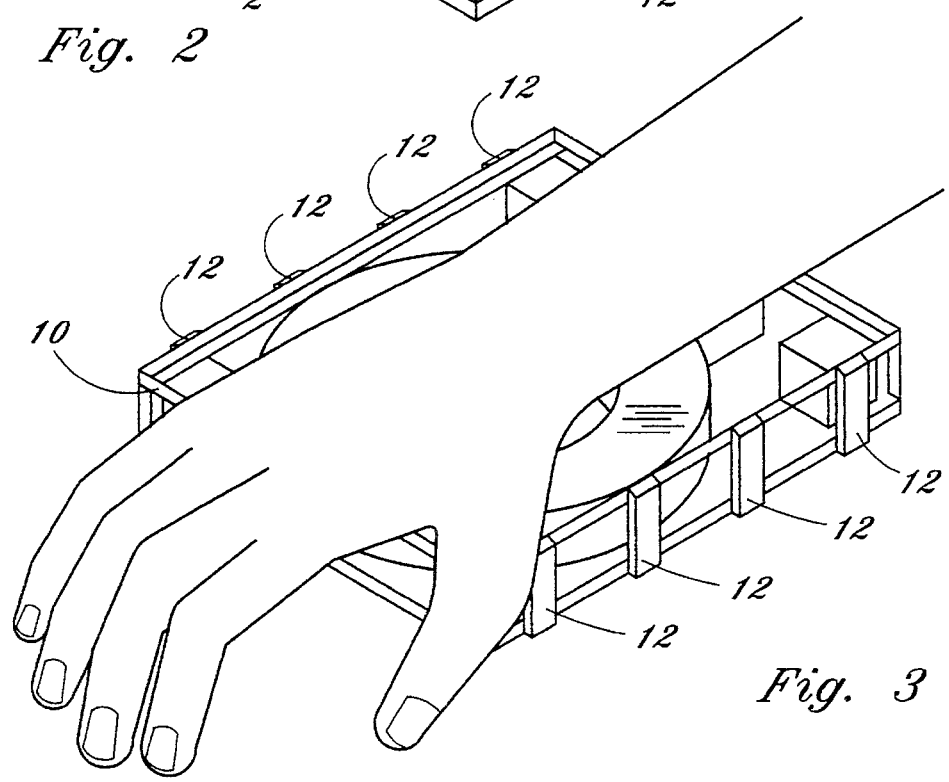
FIG. 3 is a perspective view of the holder and associated coil showing a patient's wrist positioned on top of the holder.

The box is provided with a transparent acrylic removable top 10 having a foot 11 integral with the bottom surface thereof and positioned at each corner of the top 10, the feet 11 being received within the four corners of the box and frictionally held therein, as shown in FIG. 2.

Figure 4:
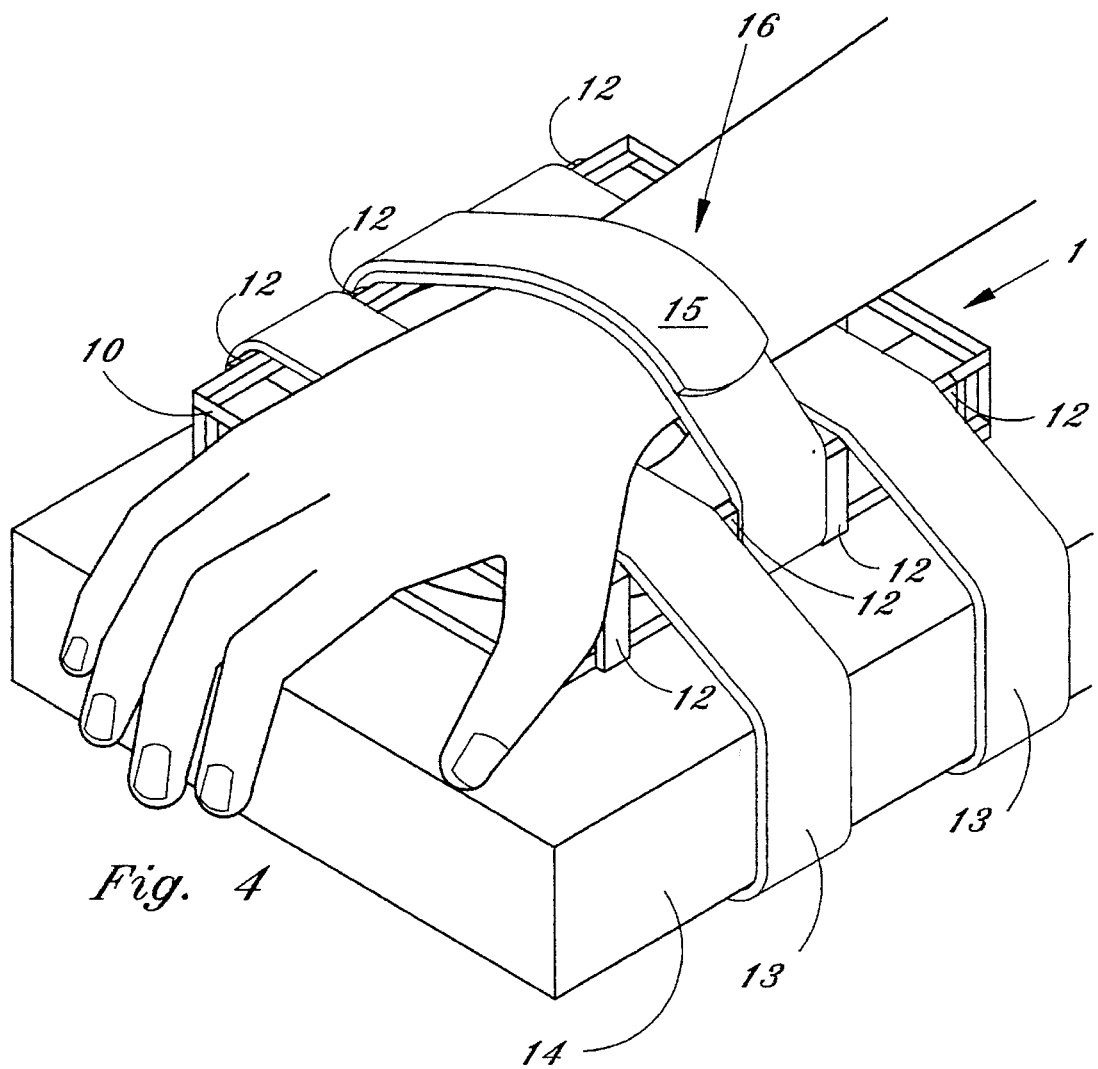
FIG. 4 is a perspective view showing the holder and associated coil being strapped to the MRI table, and a patient's wrist strapped to the holder.

A plurality of spaced pegs or posts 12 are integral with the exterior surface of each side wall 3 and 4, to thereby provide guides for straps or tape 13 extending around the box for securing the holder 1 to the MRI table or pad 14, as shown in FIG. 4, and as guides for a strap or tape 15 securing a patient's wrist 16 to the top of the holder 1. If using a strap, a Velcro® fastener will be provided to facilitate the securing of the straps 13 and 15 around the holder 1.

Figure 5:
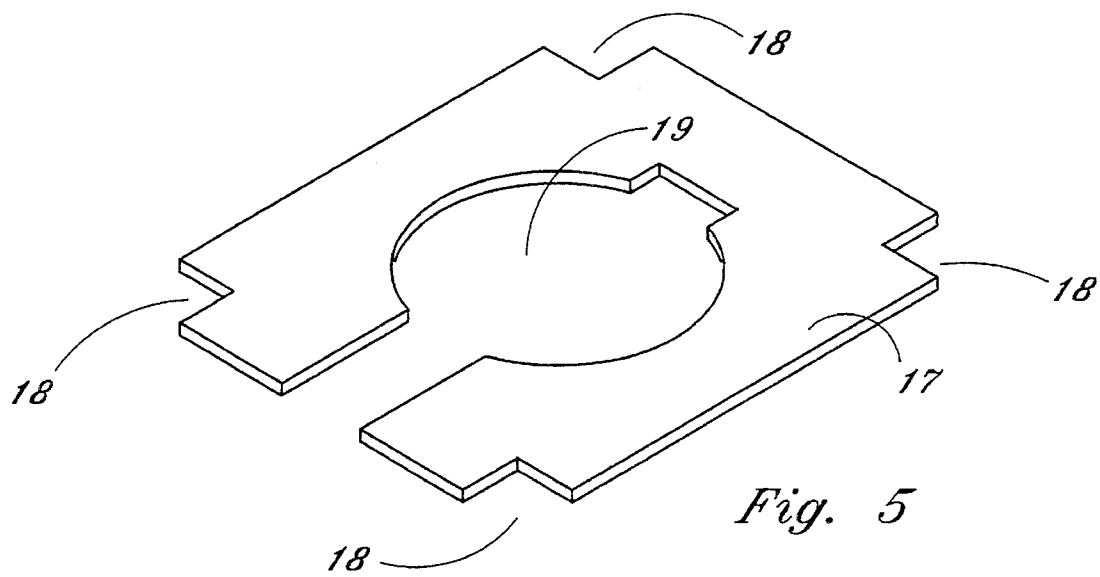
FIG. 5 is a perspective view of the holder insert for accommodating smaller surface coils.

The holder 1 is dimensioned for containing a conventional 5" surface coil; however, for imaging small children, or localized small areas on adults, a 3" surface coil can be placed in the holder 1. To accommodate the smaller coil, an insert 17, as shown in FIG. 5, is employed. The insert 17 comprises a rectangular sheet of transparent acrylic, notched as at 18 at the four corners to accommodate the feet 11 on the top 10. The main portion of the insert 17 is cut to a configuration 19 corresponding to the dimensions of a 3" surface coil. In use, the insert 17 is supported on the bottom wall 2 of the box, and engaged by the side walls 3 and 4, and end walls 5 and 16 of the box. The 3" surface coil is placed in the cut-out portion 19 of the insert, to thereby be held within the holder. By this construction and arrangement, the holder of the present invention can snugly accept either a 5" surface coil or a 3" surface coil when using the insert.

From the above description, it will be readily apparent to those skilled in the art that the holder 1 of the present invention prevents motion because the body part 16 to be imaged is securely fastened to the holder 1 and the holder is fastened to the MRI table 14. By eliminating motion, image quality is maximized, thereby improving diagnostic accuracy. The use of the surface coil holder of the present invention may obviate the need for sedation in some small children; therefore, not only is image quality improved but also the attendant risks of sedation may be eliminated.

It is to be understood that the form of the invention herewith shown and described is to be taken as a preferred example of the same, and that various changes in the shape, size and arrangement of parts may be resorted to, without departing from the spirit of the invention or scope of the subjoined claims.

I claim:

1. A surface coil holder for magnetic resonance imaging comprising, a rectangular, electromagnetically transparent box having a bottom wall, a pair of side walls, a pair of end walls, and a removable rectangular top, a conventional surface coil contained in said box, said side walls and said end walls spaced for engagement with a conventional 5" surface coil for anchoring said surface coil relative to said side walls and said end walls, an opening in one of the end walls on the box through which the surface coil cable extends for connection to a MRI scanner, a foot integral with each corner of the top and depending therefrom, each foot being received within the four corners of the box and frictionally held therein;

an insert sized for being removably mounted within said box, said insert comprising a rectangular sheet of electromagnetically transparent material, said insert capable of being selectively mounted within said box and supported on the bottom wall of said box, the peripheral edges of the insert engaging the side and end walls of the box, said rectangular sheet having a cut-out portion configured to the corresponding dimension of a conventional 3" surface coil such that a 3" surface coil may be removably inserted in said cut-out, whereby the holder is adapted to selectively contain and anchor a conventional 5" surface coil without the insert being in the box or a conventional 3" surface coil with the insert being in the box.

2. A coil holder for magnetic resonance imaging according to claim 1, further comprising means for securing said housing to a patient's body.

* * * * *